United States Patent
Huang et al.

(10) Patent No.: US 8,760,909 B2
(45) Date of Patent: Jun. 24, 2014

(54) MEMORY AND MANUFACTURING METHOD THEREOF

(75) Inventors: Jyun-Siang Huang, Hsinchu (TW); Wen-Jer Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/277,816

(22) Filed: Oct. 20, 2011

(65) Prior Publication Data

US 2013/0099303 A1    Apr. 25, 2013

(51) Int. Cl.
*G11C 11/00* (2006.01)

(52) U.S. Cl.
USPC ............... 365/148; 257/E29.309; 257/324; 257/E21.614

(58) Field of Classification Search
CPC .................................................. G11C 2213/71
USPC .......... 365/129, 145, 147, 148, 151, 153, 159
See application file for complete search history.

(56) References Cited

U.S. PATENT DOCUMENTS

| | | | |
|---|---|---|---|
| 7,851,849 B2 | 12/2010 | Kiyotoshi | |
| 8,208,279 B2 * | 6/2012 | Lue | 365/63 |
| 2010/0172183 A1 | 7/2010 | Lue et al. | |
| 2011/0101443 A1 * | 5/2011 | Huo et al. | 257/324 |
| 2011/0261607 A1 * | 10/2011 | Tang et al. | 365/148 |

FOREIGN PATENT DOCUMENTS

TW    200931643    7/2009

OTHER PUBLICATIONS

Doering, et al., Handbook of Semiconductor Manufacturing Technology, Second Edition, CRC Press, (2007); Print ISBN: 978-1-57444-675-3.*
"Office Action of Taiwan Counterpart Application", issued on Jan. 9, 2014, p. 1-p. 6, in which the listed references were cited.

* cited by examiner

*Primary Examiner* — Eva Yan Montalvo
*Assistant Examiner* — Christopher Johnson
(74) *Attorney, Agent, or Firm* — J.C. Patents

(57) ABSTRACT

A memory and a manufacturing method thereof are provided. A plurality of stacked structures extending along a first direction is formed on a substrate. Each of the stacked structures includes a plurality of first insulating layers and a plurality of second insulating layers. The first insulating layers are stacked on the substrate and the second insulating layers are respectively disposed between the adjacent first insulating layers. A plurality of trenches extending along the first direction is formed in each of the stacked structures. The trenches are respectively located at two opposite sides of each of the second insulating layers. A first conductive layer is filled in the trenches. A plurality of charge storage structures extending along a second direction is formed on the stacked structures and a second conductive layer is formed on each of the charge storage structures.

20 Claims, 5 Drawing Sheets

MEMORY AND MANUFACTURING METHOD THEREOF

BACKGROUND OF THE INVENTION

1. Field of the Invention

The invention relates to a memory and a manufacturing method thereof. More particularly, the invention relates to a memory having relatively high memory density and a manufacturing method of the memory.

2. Description of Related Art

A non-volatile memory can maintain the stored data even after the power is off, and thus the non-volatile memory has become a mandatory memory in many electronic products, so as to ensure the normal operation when the electronic products are booted.

Together with the size reduction of electronic devices, dimensions of the memory containing memory cell arrays are decreased. However, the existing photolithography technology imposes restrictions on the size reduction of a normal two-dimensional memory cell array (e.g., reduction of the distance between adjacent memory cells). Besides, the reduced size of the memory cells gives rise to the decrease in the memory density.

In order to improve the data storage capacity of the memory, a three-dimensional memory cell array has drawn attention in the industry. Unfortunately, the process of forming the current three-dimensional memory cell array is rather complicated, and the size reduction of the three-dimensional memory cell array is still subject to the existing photolithography technology.

SUMMARY OF THE INVENTION

The invention is directed to a manufacturing method of a memory. By applying the manufacturing method, the memory with relatively high memory density can be formed.

The invention is further directed to a memory with relatively high memory density.

In an embodiment of the invention, a manufacturing method of a memory is provided. In the manufacturing method, stacked structures that extend along a first direction are formed on a substrate. Each of the stacked structures includes first insulation layers and second insulation layers. The first insulation layers are stacked on the substrate, and each of the second insulation layers is located between adjacent first insulation layers. Trenches that extend along the first direction are formed in each of the stacked structures. The trenches are located at two opposite sides of each of the second insulation layers. The trenches are filled with a first conductive layer. Charge storage structures that extend along a second direction are formed on the stacked structures, and a second conductive layer is formed on each of the charge storage structures.

According to an embodiment of the invention, an etching rate of the first insulation layers is lower than an etching rate of the second insulation layers, for instance.

According to an embodiment of the invention, a material of the first insulation layers is oxide, nitride, or oxynitride, for instance.

According to an embodiment of the invention, a material of the second insulation layers is oxide, nitride, or oxynitride, for instance.

According to an embodiment of the invention, the trenches are formed by performing an isotropic etching process to remove a portion of each of the second insulation layers, for instance.

According to an embodiment of the invention, the stacked structures are formed by, for instance, first forming first insulation material layers and second insulation material layers on the substrate, and the topmost layer is one of the first insulation material layers. Mask layers that extend along the first direction are formed on the topmost first insulation layer. A portion of the first insulation material layers and a portion of the second insulation material layers are then removed with use of the mask layers as a mask.

According to an embodiment of the invention, the first conductive layer is formed by first forming a conductive material layer on the substrate, for instance. The conductive material layer covers the stacked structures, and the trenches are filled with the conductive material layer. An anisotropic etching process is performed to remove the conductive material layer outside the trenches.

According to an embodiment of the invention, the charge storage structures and the second conductive layers are formed by first forming a charge storage material layer on the substrate, for instance. The charge storage material layer covers the stacked structures. A conductive material layer is formed on the charge storage material layer. Mask layers that extend along the second direction are formed on the conductive material layer. A portion of the conductive material layer and a portion of the charge storage material layer are removed with use of the mask layers as a mask.

According to an embodiment of the invention, the charge storage material layer is a composite layer containing oxide/nitride/oxide or a composite layer containing oxide/nitride/oxide/nitride/oxide, for instance.

According to an embodiment of the invention, a material of the charge storage material layer is a material with a high dielectric constant, for instance.

In an embodiment of the invention, a memory that includes stacked structures, charge storage structures, and word lines is provided. The stacked structures are configured on the substrate and extend along a first direction. Each of the stacked structures includes first insulation layers, second insulation layers, and bit lines. The first insulation layers are stacked on the substrate. Each of the second insulation layers is configured between adjacent first insulation layers. The bit lines are configured at two opposite sides of each of the second insulation layers, respectively. The charge storage structures are configured on the substrate. Besides, the charge storage structures extend along a second direction and cover the stacked structures. The word lines are configured on the charge storage structures.

According to an embodiment of the invention, a material of the first insulation layers is different from a material of the second insulation layers, for instance.

According to an embodiment of the invention, the material of the first insulation layers is oxide, nitride, or oxynitride, for instance.

According to an embodiment of the invention, the material of the second insulation layers is oxide, nitride, or oxynitride, for instance.

According to an embodiment of the invention, a material of the bit lines is polysilicon or amorphous silicon, for instance.

According to an embodiment of the invention, a material of the charge storage structures is oxide/nitride/oxide, oxide/nitride/oxide/nitride/oxide, or a material with a high dielectric constant, for instance.

According to an embodiment of the invention, a material of the word lines is polysilicon, for instance.

According to an embodiment of the invention, each of the charge storage structures is a composite layer containing oxide/nitride/oxide or a composite layer containing oxide/nitride/oxide/nitride/oxide, for instance.

According to an embodiment of the invention, a material of each of the charge storage structures is a material with a high dielectric constant, for instance.

According to an embodiment of the invention, the substrate is a dielectric substrate formed on a silicon wafer, for instance.

Based on the above, the insulation layers with different etching rates are alternately stacked on the substrate, and regions that are about to be filled with the bit lines are formed by etching a portion of the insulation layers. Hence, the restrictions imposed by the existing photolithography technology can be lifted, and the bit lines with the reduced size can be formed. In addition, by adjusting the thickness of the insulation layers, the distance between the bit lines in upper and lower layers can be reduced (i.e., the distance between the adjacent memory cells is shortened), which can also lift the restrictions imposed by the existing photolithography technology on the distance between the adjacent memory cells. As such, the memory described in this invention can have relatively high memory density.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
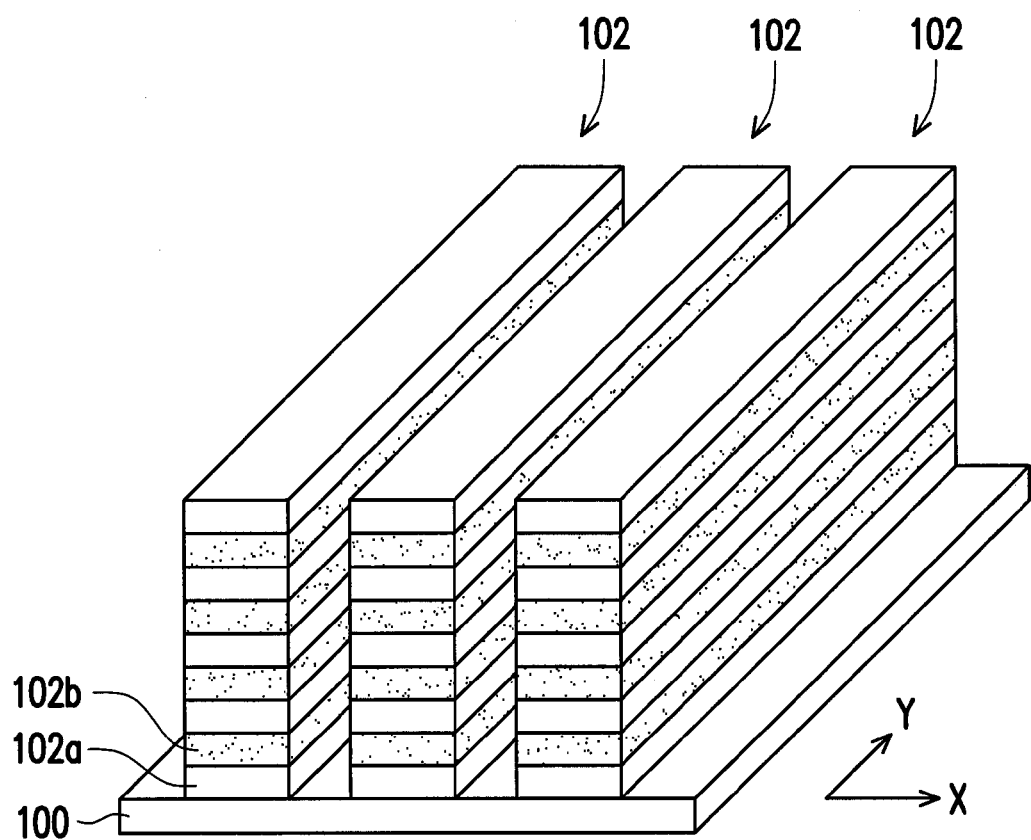
FIG. 1A through FIG. 1E are three-dimensional views illustrating a process of manufacturing a memory according to an embodiment of the invention.

FIG. 1A through FIG. 1E are three-dimensional views illustrating a process of manufacturing a memory according to an embodiment of the invention. With reference to FIG. 1A, stacked structures 102 that extend along a Y direction are formed on a substrate 100. The substrate 100 is a dielectric substrate formed on a silicon wafer, for instance. A material of the substrate 100 is, for example, oxide. Each of the stacked structures 102 includes first insulation layers 102a and second insulation layers 102b. The first insulation layers 102a are stacked on the substrate 100, and the second insulation layers 102b are respectively located between adjacent first insulation layers 102a. Namely, the first insulation layers 102a and the second insulation layers 102b are sequentially and alternately formed on the substrate 100, and the topmost layer is one of the first insulation layers 102a. A material of the first insulation layers 102a is different from a material of the second insulation layers 102b, for instance. In this embodiment, the etching rate of the first insulation layers 102a is lower than the etching rate of the second insulation layers 102b, which is conducive to the subsequent etching process and will be elaborated hereinafter. The material of the first insulation layers 102a can be oxide ($Hf_2O$, $Al_2O_3$, $SiO_2$, silicon-rich $SiO_2$, and so on), nitride ($Si_3N_4$, silicon-rich $Si_3N_4$, and so on), or oxynitride (SiON). The material of the second insulation layers 102b can also be oxide, nitride, or oxynitride as long as the etching rate of the first insulation layers 102a is lower than the etching rate of the second insulation layers 102b in the following etching process. It should be mentioned that the etching rate of the substrate 100 is also lower than the etching rate of the second insulation layers 102b, so as to prevent the substrate 100 from being severely damaged in the following etching process.

To be more specific, the stacked structures 102 are formed by first forming first insulation material layers and second insulation material layers on the substrate 100 sequentially, for instance, and the topmost layer is one of the first insulation material layers. Mask layers that extend along the Y direction are formed on the topmost first insulation material layer, and the mask layers cover the regions where the stack structures 102 are to be formed. An anisotropic etching process is performed with use of the mask layers as a mask, so as to remove a portion of the first insulation material layers and a portion of the second insulation material layers. In this embodiment, only three stacked structures 102 are depicted for illustrative purposes, which should not be construed as a limitation to the invention. In addition, the number of the film layers in the stacked structures 120 is not limited in the invention.

Figure 1B:
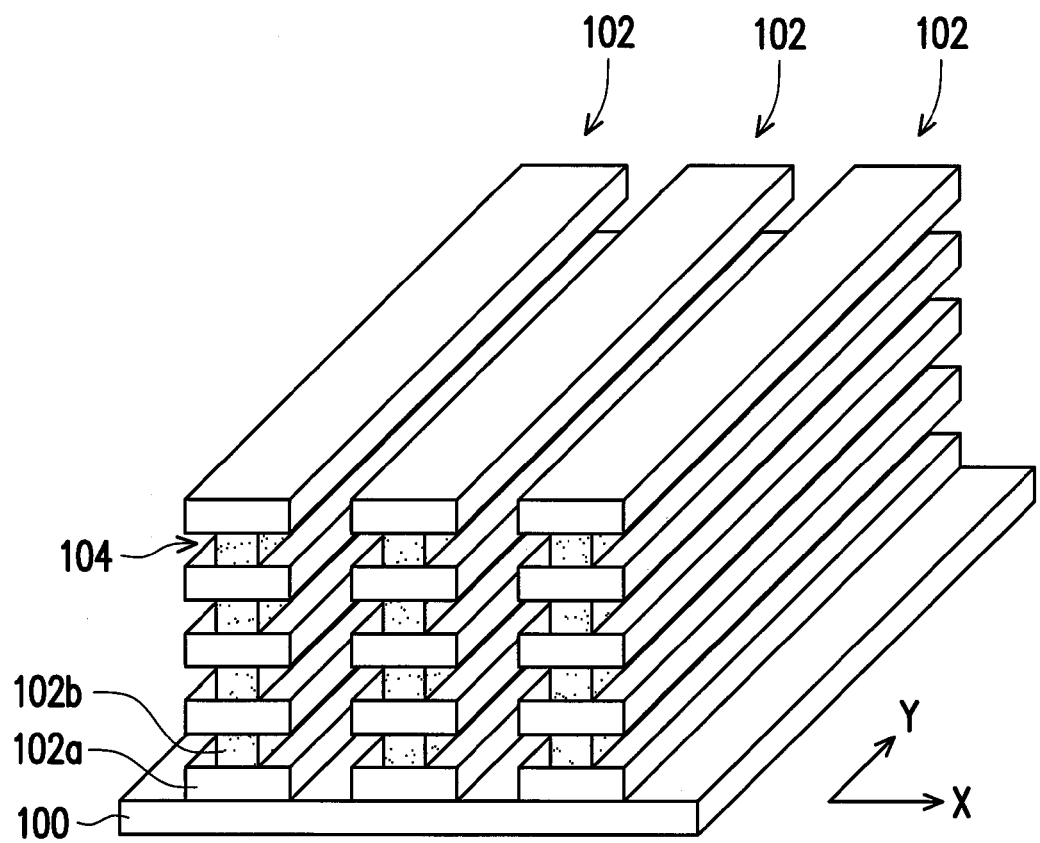

With reference to FIG. 1B, trenches 104 that extend along the Y direction are formed in each of the stacked structures 102. The trenches 104 are located at two opposite sides of each of the second insulation layers 102b. Here, the trenches 104 are formed by performing an isotropic etching process to remove a portion of the second insulation layers 102b, for instance. Both the etching rate of the first insulation layers 102a and the etching rate of the substrate 100 are lower than the etching rate of the second insulation layers 102b. Accordingly, in the isotropic etching process, a portion of the second insulation layers 102b at two sides of the stacked structures 102 can be easily removed, so as to form the trenches 104 without causing severe damages to the second insulation layers 102b and the substrate 100. The trenches 104 are the places where the bit lines are to be formed subsequently, and the depth of the trenches 104 can be adjusted by controlling the etching time. Thereby, the dimensions of the subsequently-formed bit lines can be controlled. Besides, in this embodiment, the regions where the bit lines are located are formed by performing an etching process. Thus, the restrictions imposed by the existing photolithography technology can be lifted, and the device dimensions can be further reduced.

Figure 1C:
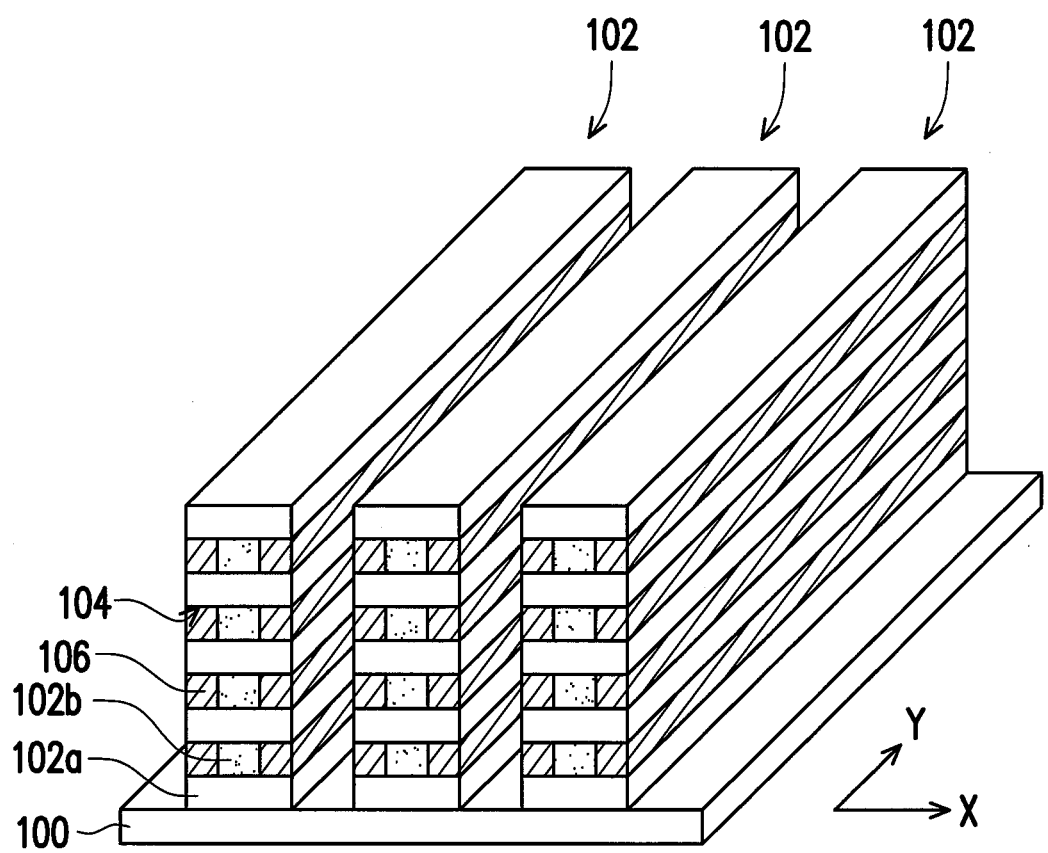

With reference to FIG. 1C, the trenches 104 are filled with a conductive layer 106. The conductive layer 106 serves as the bit lines in the subsequently-formed memory. A material of the conductive layer 106 is, for instance, polysilicon or amorphous silicon. The conductive layer 106 is formed by first forming a conductive material layer on the substrate 100, for instance. The conductive material layer covers the stacked structures 102, and the trenches 104 are filled with the conductive material layer. An anisotropic etching process is performed to remove the conductive material layer outside the trenches 104. Here, each of the stacked structures 102 includes the first insulation layers 102a, the second insulation layers 102b, and the conductive layers 106 (i.e., the bit lines), and two conductive layers 106 are respectively located at two opposite sides of each of the second insulation layers 102b.

Figure 1D:
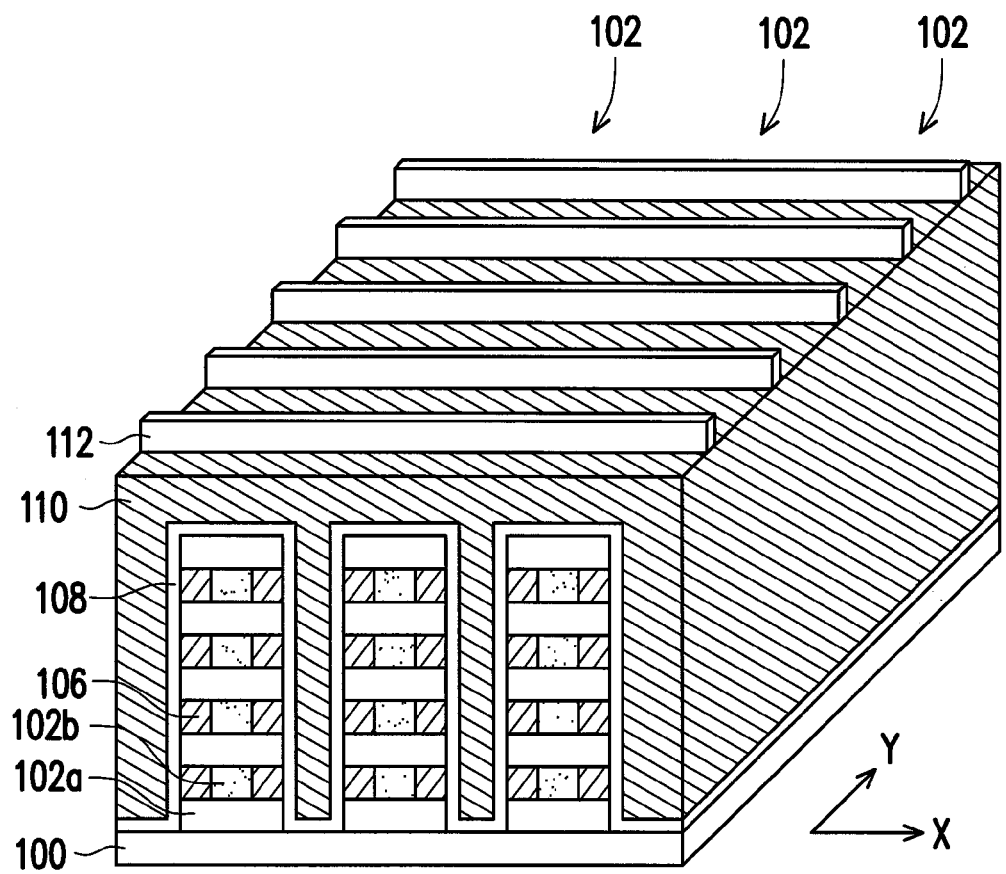

With reference to FIG. 1D, a charge storage material layer 108 that covers the stacked structures 102 is conformally formed on the substrate 100. The charge storage material layer 108 is made of a composite layer containing oxide/nitride/oxide (i.e., an ONO layer), a composite layer containing oxide/nitride/oxide/nitride/oxide (i.e., an ONONO layer), or a material layer with a high dielectric constant, for instance. Since the way to form the charge storage material layer 108 is well known to people having ordinary skill in the art, no further explanation is given hereinafter. A conductive material layer 110 is formed on the charge storage material layer 108. A material of the conductive material layer 110 is, for instance, polysilicon. Mask layers 112 that extend along an X direction are formed on the conductive material layer 110. The mask layers 112 are photoresist layers, for instance, and the mask layers 112 cover the regions where the word lines are to be formed subsequently.

Figure 1E:
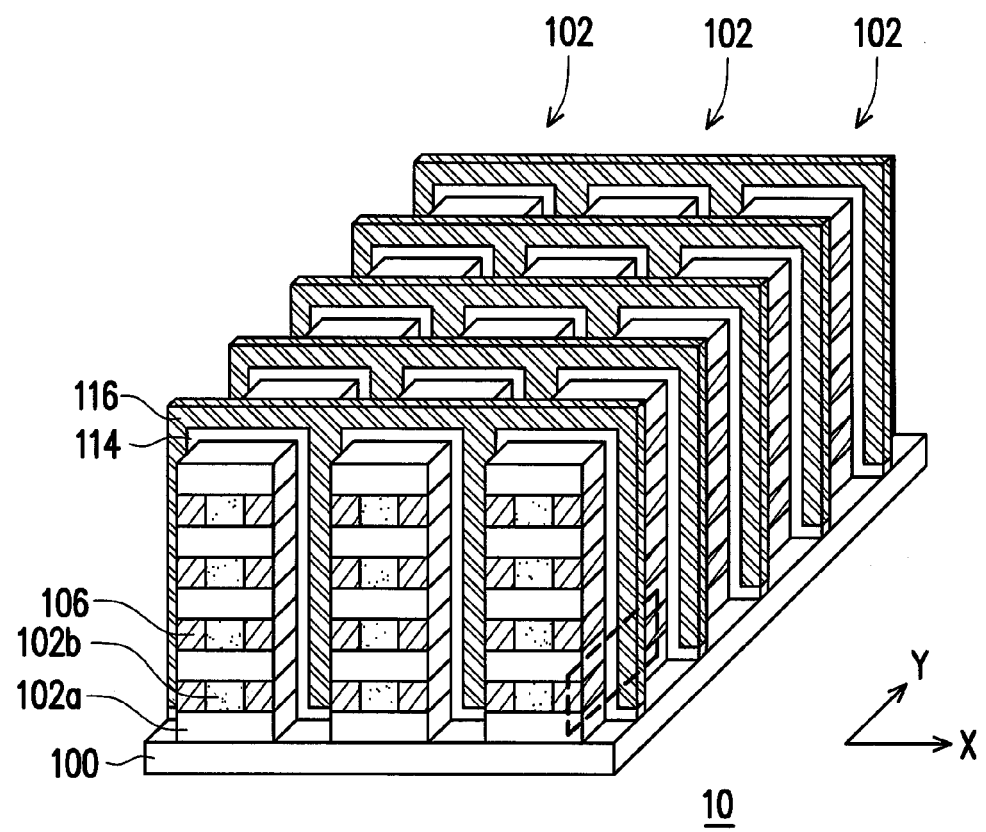

With reference to FIG. 1E, a portion of the conductive material layer 110 and a portion of the charge storage material layer 108 are removed with use of the mask layers 112 as a mask, so as to form charge storage structures 114 and word lines 116. The charge storage structures 114 extend along the X direction and cover the stacked structures 102, and the word lines 116 are located on the charge storage structures 114. Thereby, the three-dimensional memory 10 with relatively high memory density can be formed.

In the memory 10 of this embodiment, each of the stacked structures 102 has first and second insulation layers 102a and 102b that are sequentially and alternately stacked, and one bit line 106 is configured at two opposite sides of each of the second insulation layers 102b. Thereby, the memory density of the memory 10 can be effectively improved.

In particular, the memory 10 has four second insulation layers 102b, and two bit lines 106 are respectively configured at two opposite sides of each of the second insulation layers 102b. Besides, five charge storage structures 114 and five word lines 116 are configured on each of the stacked structures 102. Hence, in the memory 10 shown in FIG. 1E, each of the stacked structures 102, the charge storage structures 114 on the stacked structures 102, and the word lines 116 on the stacked structures 102 can together constitute 40 memory cells (a memory cell is shown by dotted lines), such that the memory 10 can have relatively high memory density.

Additionally, in the memory 10, the distance between the memory cells in the upper and lower layers is the thickness of the first insulation layers 102a. That is to say, in this embodiment, the distance between the memory cells in the upper and lower layers can be controlled by adjusting the thickness of the first insulating layers 102a. Therefore, the restrictions imposed by the existing photolithography technology can be lifted, and the distance between the adjacent memory cells can be further reduced.

Moreover, the well-known Fowler-Nordheim injection is applicable to the memory 10 described in this embodiment, so as to program the memory 10 and erase data stored in the memory 10.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of a memory, comprising:
    forming a plurality of stacked structures on a substrate, the stacked structures extending along a first direction, each of the stacked structures comprising a plurality of first insulation layers and a plurality of second insulation layers, the first insulation layers being stacked on the substrate, each of the second insulation layers being respectively located between two adjacent first insulation layers of the first insulation layers;
    removing a first portion of each of the second insulation layers and retaining a second portion of the each of the second insulation layers to form a plurality of trenches in each of the stacked structures, the trenches extending along the first direction and being located at two opposite sides of the second portion of the each of the second insulation layers;
    filling the trenches with a first conductive layer; and
    forming a plurality of charge storage structures on the stacked structures and forming a second conductive layer on each of the charge storage structures, the charge storage structures extending along a second direction.

2. The manufacturing method of the memory as recited in claim 1, wherein an etching rate of the first insulation layers is lower than an etching rate of the second insulation layers.

3. The manufacturing method of the memory as recited in claim 2, wherein a material of the first insulation layers comprises oxide, nitride, or oxynitride.

4. The manufacturing method of the memory as recited in claim 2, wherein a material of the second insulation layers comprises oxide, nitride, or oxynitride.

5. The manufacturing method of the memory as recited in claim 2, wherein a method of forming the trenches comprises performing an isotropic etching process to remove a portion of each of the second insulation layers.

6. The manufacturing method of the memory as recited in claim 1, wherein a method of forming the stacked structures comprises:
    forming a plurality of first insulation material layers and a plurality of second insulation material layers on the substrate, one of the first insulation material layers being formed at a top of the first and second insulation material layers;
    forming a plurality of mask layers on the topmost first insulation material layer, the mask layers extending along the first direction; and
    removing a portion of the first insulation material layers and a portion of the second insulation material layers with use of the mask layers as a mask.

7. The manufacturing method of the memory as recited in claim 1, wherein a method of forming the first conductive layer comprises:
    forming a conductive material layer on the substrate, the conductive material layer covering the stacked structures, the trenches being filled with the conductive material layer; and
    performing an anisotropic etching process to remove the conductive material layer outside the trenches.

8. The manufacturing method of the memory as recited in claim 1, wherein a method of forming the charge storage structures and the second conductive layers comprises:
    forming a charge storage material layer on the substrate, the charge storage material layer covering the stacked structures;
    forming a conductive material layer on the charge storage material layer;
    forming a plurality of mask layers on the conductive material layer, the mask layers extending along the second direction; and
    removing a portion of the conductive material layer and a portion of the charge storage material layer with use of the mask layers as a mask.

9. The manufacturing method of the memory as recited in claim 8, wherein the charge storage material layer comprises a composite layer containing oxide/nitride/oxide or a composite layer containing oxide/nitride/oxide/nitride/oxide.

10. The manufacturing method of the memory as recited in claim 8, wherein a material of the charge storage material layer comprises a material with a high dielectric constant.

11. A memory comprising:
a plurality of stacked structures configured on a substrate and extending along a first direction, each of the stacked structures comprising:
a plurality of first insulation layers stacked on the substrate;
a plurality of second insulation layers respectively configured between adjacent first insulation layers; and
a plurality of bit lines configured at two opposite sides of each of the second insulation layers, wherein the plurality of bit lines is in contact with the adjacent first insulation layers;
a plurality of charge storage structures configured on the substrate, the charge storage structures extending along a second direction and covering the stacked structures; and
a plurality of word lines configured on the charge storage structures.

12. The memory as recited in claim 11, wherein a material of the first insulation layers is different from a material of the second insulation layers.

13. The memory as recited in claim 12, wherein the material of the first insulation layers comprises oxide, nitride, or oxynitride.

14. The memory as recited in claim 12, wherein the material of the second insulation layers comprises oxide, nitride, or oxynitride.

15. The memory as recited in claim 11, wherein a material of the bit lines comprises polysilicon or amorphous silicon.

16. The memory as recited in claim 11, wherein a material of the charge storage structures comprises oxide/nitride/oxide, oxide/nitride/oxide/nitride/oxide, or a material with a high dielectric constant.

17. The memory as recited in claim 11, wherein a material of the word lines comprises polysilicon.

18. The memory as recited in claim 11, wherein each of the charge storage structures comprises a composite layer containing oxide/nitride/oxide or a composite layer containing oxide/nitride/oxide/nitride/oxide.

19. The memory as recited in claim 11, wherein a material of each of the charge storage structures comprises a material with a high dielectric constant.

20. The memory as recited in claim 11, wherein the substrate comprise a dielectric substrate formed on a silicon wafer.

* * * * *